United States Patent
Petrovic

(10) Patent No.: US 9,197,268 B1
(45) Date of Patent: Nov. 24, 2015

(54) METHOD AND APPARATUS FOR COMPENSATING FOR IQ MISMATCH IN RADIO FREQUENCY RECEIVERS

(71) Applicant: Marvell International Ltd., Hamilton (BM)

(72) Inventor: Vladan Petrovic, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/670,880

(22) Filed: Mar. 27, 2015

Related U.S. Application Data

(60) Provisional application No. 61/971,514, filed on Mar. 27, 2014.

(51) Int. Cl.
  *H03D 1/00* (2006.01)
  *H04L 27/06* (2006.01)
  *H04B 1/12* (2006.01)

(52) U.S. Cl.
  CPC .................................... *H04B 1/123* (2013.01)

(58) Field of Classification Search
  CPC .......... H04B 1/30; H04B 1/0475; H04B 1/62; H04B 1/1027; H04B 17/0085; H04B 17/10; H04B 17/20; H04B 1/74; H04B 2001/0425; H04B 2001/0433; H04B 1/001; H04B 1/0021; H04B 1/40; H04L 27/3863
  USPC .......................................... 375/343, 346, 348
  See application file for complete search history.

(56) References Cited

U.S. PATENT DOCUMENTS

| | | | |
|---|---|---|---|
| 2004/0219884 A1* | 11/2004 | Mo et al. | 455/67.11 |
| 2005/0276354 A1* | 12/2005 | Su et al. | 375/326 |
| 2012/0270516 A1* | 10/2012 | Kang et al. | 455/233.1 |

OTHER PUBLICATIONS

IEEE Std. 802.11-2012; (Revision of IEEE Std. 802.11-2007); IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.

802.16-2009 (Revision of IEEE Std. 802.16-2004); IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.

(Continued)

*Primary Examiner* — Qutbuddin Ghulamali

(57) ABSTRACT

A receiver including a physical layer module, a function module, a residual module, an IQ mismatch module, and a compensation module. The physical layer module is configured to (i) receive a signal, and (ii) downconvert the signal to generate a downconverted signal, wherein the downconverted signal has IQ mismatch. The function module is configured to determine (i) a first value based on a first function and a resultant signal, and (ii) a second value based on a second function. The residual module is configured to estimate a residual IQ mismatch based on the first value and the second value. The IQ mismatch module is configured to estimate an IQ mismatch coefficient based on the estimate of the residual IQ mismatch. The compensation module is configured to compensate for the IQ mismatch of the downconverted signal including generating the resultant signal based on the estimate of the IQ mismatch.

17 Claims, 5 Drawing Sheets

(56) References Cited

OTHER PUBLICATIONS

IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.

IEEE P802.11ac / D2.0; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Jan. 2012; 359 pages.

IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.

IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

IEEE P802.11ax; Selection Procedure Draft Standard IEEE 802.11-014/0938-03-00ax, Jul. 2014; IEEE 082.11-14/0980r6 IEEE P802.11 Wireless LANs, Jul. 2014; 11ax Evaluation Methodology, Jan. 15, 2015; IEEE 802.11ax Channel Model Document IEEE 802.11-14/0882r4, Sep. 16, 2014; Proposed 802.11ax Functional Requirements, May 2014; Specification Framework for TGax IEEE 802.11-15/0132r2, Jan. 2015; Total pp. 117.

"Specification of the Bluetooth System" Master Table of Contents & Compliance Requirements—Covered Core Package version: 4.0; Jun. 30, 2010; 2302 pages.

* cited by examiner

METHOD AND APPARATUS FOR COMPENSATING FOR IQ MISMATCH IN RADIO FREQUENCY RECEIVERS

CROSS-REFERENCE TO RELATED APPLICATIONS

This application claims the benefit of U.S. Provisional Application No. 61/971,514, filed on Mar. 27, 2014. The entire disclosure of the application referenced above is incorporated herein by reference.

FIELD

The present disclosure relates to wireless communication, and more particularly to IQ mismatch experienced at a radio frequency receiver.

BACKGROUND

A radio frequency (RF) receiver can downconvert a modulated signal at a carrier frequency to a downconverted signal that is at a baseband frequency. During the downconversion of the modulated signal, certain receiver impairments are introduced due to a non-ideal behavior caused by component process-voltage-temperature (PVT) variations. The receiver impairments degrade system performance. The receiver impairments can be minimized via signal processing. Receiver impairments introduced by a homodyne (direct-conversion) receiver include carrier frequency offset (CFO), IQ mismatch, DC offset, phase noise, etc.

FIG. 1 shows a perfect (or ideal) downconversion circuit 10, operating based on 90° out-of-phase local oscillator signals. The downconversion circuit 10 includes mixers 12, 14 and low pass filters 16, 18. The mixers 12, 14 receive a modulated signal $x_{RF}(t)$ that consists of a baseband signal $x(t)$, which has shifted to a carrier frequency during transmission. The modulated signal $x_{RF}(t)$ may be represented by equation 1 and the baseband signal may be represented by equation 2.

$$x_{RF}(t) = x_I(t)\cos\omega_c t - x_Q(t)\sin\omega_c t \quad (1)$$

$$x(t) = x_I(t) + jx_Q(t) \quad (2)$$

The mixers 12, 14 receive and multiply the modulated signal $x_{RF}(t)$ by local oscillator signals $2\cos\omega_c t$, $2\sin\omega_c t$ (referred to as "quadrature mixing") to generate I and Q baseband signal components $x_I(t)$, $x_Q(t)$ and some unwanted high frequency components. The filters 16, 18 subsequently filter out the unwanted high frequency components from the mixer outputs. Deviation from a 90° difference in phase between the I and Q baseband signal components and difference in gains between the I and Q baseband signal components results in distortion and degrades quality of the resulting baseband signal $x(t)$.

FIG. 2 shows another downconversion circuit 20 operating based on local oscillator signals that are gain and phase mismatched relative to each other. The downconversion circuit 20 includes mixers 22, 24 and low pass filters 26, 28. The mixers 22, 24 receive and multiply a modulated signal $x_{RF}(t)$ by local oscillator signals $$2\left(1+\frac{\varepsilon}{2}\right)\cos\left(\omega_c t + \frac{\theta}{2}\right), -2\left(1-\frac{\varepsilon}{2}\right)\sin\left(\omega_c t - \frac{\theta}{2}\right)$$

that are gain and phase mismatched causing a non-ideal downconversion. The non-ideal downconversion results in mixing of I and Q components of the corresponding baseband signal components to provide received signal components with $w_I(t)$ and $w_Q(t)$ having IQ mismatch. The received signal components with $w_I(t)$ and $w_Q(t)$ may be represented by equations 3 and 4, where $\varepsilon$ and $\theta$ are respectively gain and phase mismatch parameters.

$$w_I(t) = \left(1+\frac{\varepsilon}{2}\right)\left(x_I(t)\cos\frac{\theta}{2} + x_Q(t)\sin\frac{\theta}{2}\right) \quad (3)$$

$$w_Q(t) = \left(1-\frac{\varepsilon}{2}\right)\left(x_I(t)\sin\frac{\theta}{2} + x_Q(t)\cos\frac{\theta}{2}\right) \quad (4)$$

Equations 3 and 4 can be represented in a complex form, as shown by equation 5, where equation 6 provides the received signal $w(t)$ with IQ mismatch, equation 7 provides the baseband equivalent received signal prior to IQ mismatch $x(t)$, and equation 8 provides a corresponding complex IQ mismatch parameter $a$.

$$w(t) = \quad (5)$$
$$\left(\cos\frac{\theta}{2} - j\frac{\varepsilon}{2}\sin\frac{\theta}{2}\right)x(t) + \left(\frac{\varepsilon}{2}\cos\frac{\theta}{2} + j\sin\frac{\theta}{2}\right)x^*(t) \approx x(t) + a(m)\cdot x^*(t)$$

$$w(t) = w_I(t) + jw_Q(t) \quad (6)$$

$$x(t) = x_I(t) + jx_Q(t) \quad (7)$$

$$a = \frac{\varepsilon}{2} + j\frac{\theta}{2} \quad (8)$$

A final approximation in equation 5 for the received signal $w(t)$ may be obtained by assuming that the gain and phase mismatch parameters $\varepsilon, \theta$ are small values. In the frequency domain, the received signal $w(t)$ may be represented by equation 9, which shows that IQ mismatch introduces an image $a \cdot X^*(-f)$ into the corresponding signal spectrum.

$$W(f) = X(f) + a \cdot X^*(-f) \quad (9)$$

The image $a \cdot X^*(-f)$ is a frequency byproduct of the actual signal $X(f)$.

SUMMARY

A receiver is provided and includes a physical layer module, a function module, a residual module, an IQ mismatch module, and a compensation module. The physical layer module is configured to (i) receive a signal, and (ii) downconvert the signal to generate a downconverted signal, wherein the downconverted signal has IQ mismatch. The function module is configured to determine (i) a first value based on a first function and a resultant signal, and (ii) a second value based on a second function. The residual module is configured to estimate a residual IQ mismatch based on the first value and the second value. The IQ mismatch module is configured to estimate an IQ mismatch coefficient based on the estimate of the residual IQ mismatch. The compensation module is configured to compensate for the IQ mismatch of the downconverted signal including generating the resultant signal based on the estimate of the IQ mismatch.

In other features, a method is provided and includes: receiving a signal; downconverting the signal to generate a downconverted signal, wherein the downconverted signal has IQ mismatch; determining (i) a first value based on a first function and a resultant signal, and (ii) a second value based on a second function; estimating a residual IQ mismatch based on the first value and the second value; estimating an IQ mismatch coefficient based on the estimate of the residual IQ mismatch; and compensating for the IQ mismatch of the downconverted signal including generating the resultant signal based on the estimate of the IQ mismatch coefficient.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
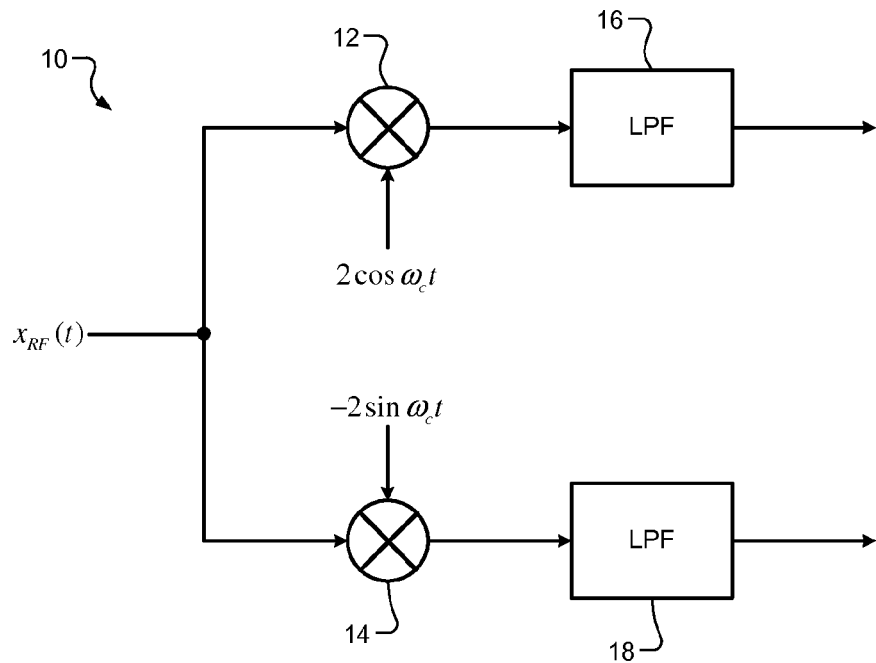
FIG. 1 is a schematic view of a perfect downconversion circuit operating based on 90° out-of-phase local oscillator signals.
Figure 2:
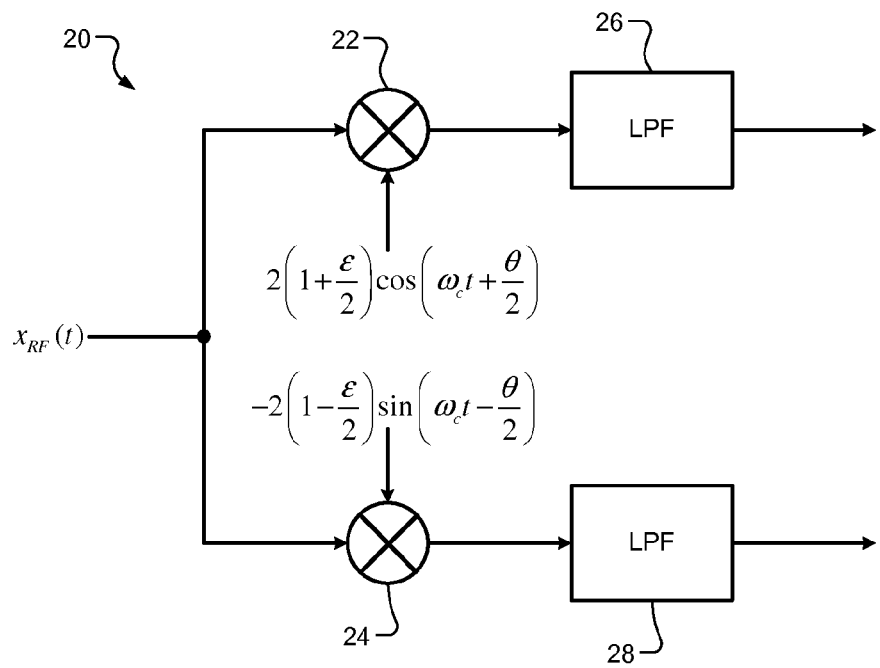
FIG. 2 is a schematic view of a traditional downconversion circuit operating based on local oscillator signals that are gain and phase mismatched relative to each other.

Non-ideal downconversion at a receiver of a received signal $x_{RF}(t)$ results in a received baseband signal $w(t)$ with I and Q components with $w_I(t)$ and $w_Q(t)$ having IQ mismatch. The received signal $x_{RF}(t)$ is is a signal transmitted over the air and has components around a carrier, which is at a high frequency (e.g., in GHz range). In contrast, a received signal $x(t)$ is a baseband signal that is obtained if a perfect downconversion is performed via, for example, the downconversion circuit of FIG. 1. $x(t)$ has components at low frequencies compared to the carrier (e.g., in MHz range). In the absence of noise, $x(t)$ is exactly equal to the transmitted baseband signal (prior to up-conversion at the corresponding transmitter). Compensation may be applied in the time domain to minimize the IQ mismatch. The compensation may be represented by equation 10, where a is a complex IQ mismatch introduced by the non-ideal downconversion, $â$ is a complex IQ mismatch compensation coefficient (or an estimated value of IQ mismatch), $Δâ$ is a residual IQ mismatch after compensation and is equal to $a-â$, $w^*(t)$ is the conjugate of the received baseband signal $w(t)$, and $x^*(t)$ is the conjugate of the desired received signal free of IQ mismatch $x(t)$.

$$y(t)=w(t)-âw^*(t)≈x_{RF}(t)+(a-â)x_{RF}^*(t)=x_{RF}(t)+Δâ\cdot x_{RF}^*(t) \quad (10)$$

Notice that if estimated coefficient $â$ converges to a (i.e., $Δâ$ converges to zero), the received signal $y(t)$ converges to the desired signal free of IQ mismatch $x(t)$. Although the complex compensation coefficient $â$ may be determined using an offline calibration procedure, the following examples estimate complex compensation coefficients based on received signals during system operation. The following examples address receiver IQ mismatch estimation and compensation based on received time domain samples during system runtime without interruption to system operations. This indirectly accounts for IQ mismatch changes due to temperature variations and/or aging of system components. This provides a robust system that accounts for changes in the IQ mismatch coefficient a as a result of changes in temperature and/or component performance due to aging.

Figure 3:
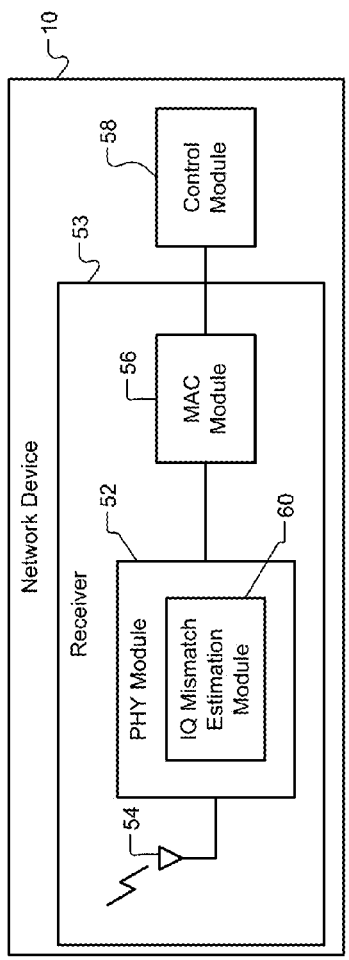
FIG. 3 is a functional block diagram of a network device incorporating a medium access control module performing IQ mismatch estimation and compensation in accordance with the present disclosure.

FIG. 3 shows a network device 50 incorporating a physical layer (PHY) module 52 performing IQ mismatch estimation and compensation. The network device 50 may refer to a computer, a tablet, a mobile device, a cellular phone, a router, an appliance, a tool, and/or other network device. The network device 50 may wirelessly communicate with other network devices using Institute of Electrical and Electronic Engineers (IEEE), Wi-Fi™, Bluetooth®, and/or other wireless protocols. Wireless signals transmitted by the network devices may be radio frequency (RF) and/or frequency modulated (FM) signals. The wireless signals may be transmitted in, for example, the Industrial, Scientific and Medical (ISM) 2.4 GHz short-range radio frequency band or other suitable band.

The network device 50 includes a receiver 53. The receiver 53 includes the PHY module 52, an antenna 54 and a medium access control (MAC) module 56. The receiver 53 also includes a control module 58. The PHY module 52 may include an IQ mismatch estimation module 60, which estimates IQ mismatch. During operation, a signal is received via the antenna 54 and demodulated and downconverted by the PHY module 52 to provide a downconverted signal. The downconverted signal may have IQ mismatch, which is estimated by the IQ mismatch estimation module 60. The IQ mismatch estimation module 60 compensates for the IQ mismatch prior to providing a resultant signal to the MAC module 56. The MAC module 56 provides data corresponding to the resultant signal to the control module 58. Although shown as being performed in the PHY module 52, the IQ mismatch estimation and compensation may be performed by the MAC module 56.

Figure 4:
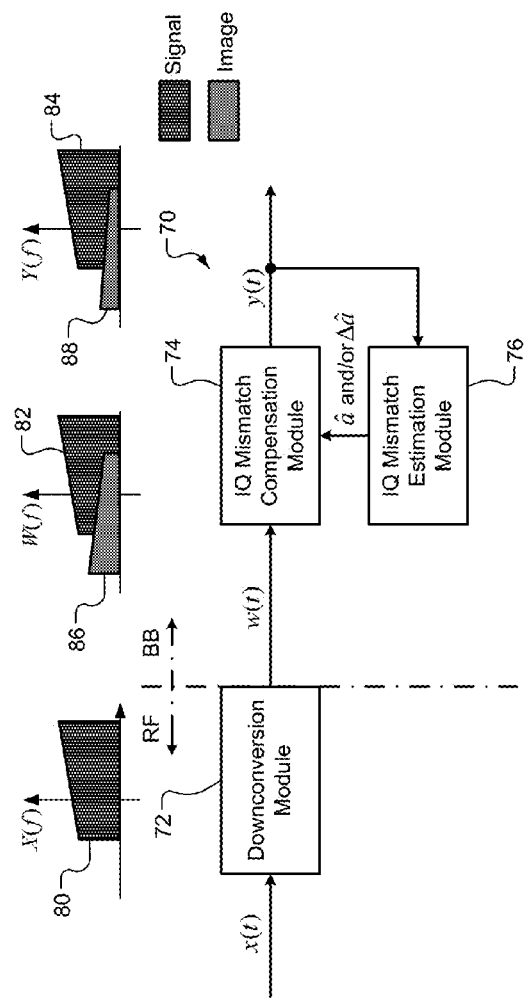
FIG. 4 is a functional block diagram of an IQ mismatch compensation circuit in accordance with the present disclosure.

FIG. 4 shows an IQ mismatch compensation circuit 70. The IQ mismatch compensation circuit 70 includes a downconversion module 72, an IQ mismatch compensation module 74 and the IQ mismatch estimation module 60. The downconversion module 72 may be considered in the RF domain. The IQ mismatch compensation module 74 and the IQ mismatch estimation module 76 may be considered in the baseband domain. The downconversion module 72 downconverts the received signal $x_{RF}(t)$ to a downconverted signal $w(t)$. The IQ mismatch compensation module 74 compensates for IQ mismatch based on a complex compensation coefficient $â$ to provide a resultant signal $y(t)$. The resultant signal $y(t)$ may be provided to other time and/or frequency processing modules of the PHY module 52 and/or MAC module 56 and/or the control module 58 of the network device 50 of FIG. 3. The IQ mismatch estimation module 60 estimates the IQ mismatch, which is represented by the complex compensation coefficient $â$. The IQ mismatch estimation module 60 estimates the complex compensation coefficient $â$ based on the residual IQ mismatch $Δâ$. Relationships between $x(t)$, $w(t)$, and $y(t)$ are provided by equations 11 and 12.

$$w(t)=x(t)+a \cdot x^*(t) \quad (11)$$

$$y(t)=w(t)-\hat{a}(m) \cdot w^*(t) \approx x(t)+\Delta\hat{a}(m) \cdot x^*(t) \quad (12)$$

Example frequency domain plots 80, 82, 84 are shown for $X((f))$, $W((f))$, and $Y((f))$, which correspond to $x(t)$, $w(t)$, and $y(t)$. In addition, images 86, 88 for IQ mismatch are shown overlapping the frequency domain plots for $W((f))$ and $Y((f))$. As can be seen, the images 86, 88 are a mirror image of $W((f))$ and $Y((f))$, are shifted in frequency from $W((f))$ and $Y((f))$, and have magnitudes that are less than magnitudes of $W((f))$ and $Y((f))$. Also, the magnitudes of the image 88 are less than magnitudes of the image 86. This is due to the IQ mismatch compensation performed.

Figure 5:
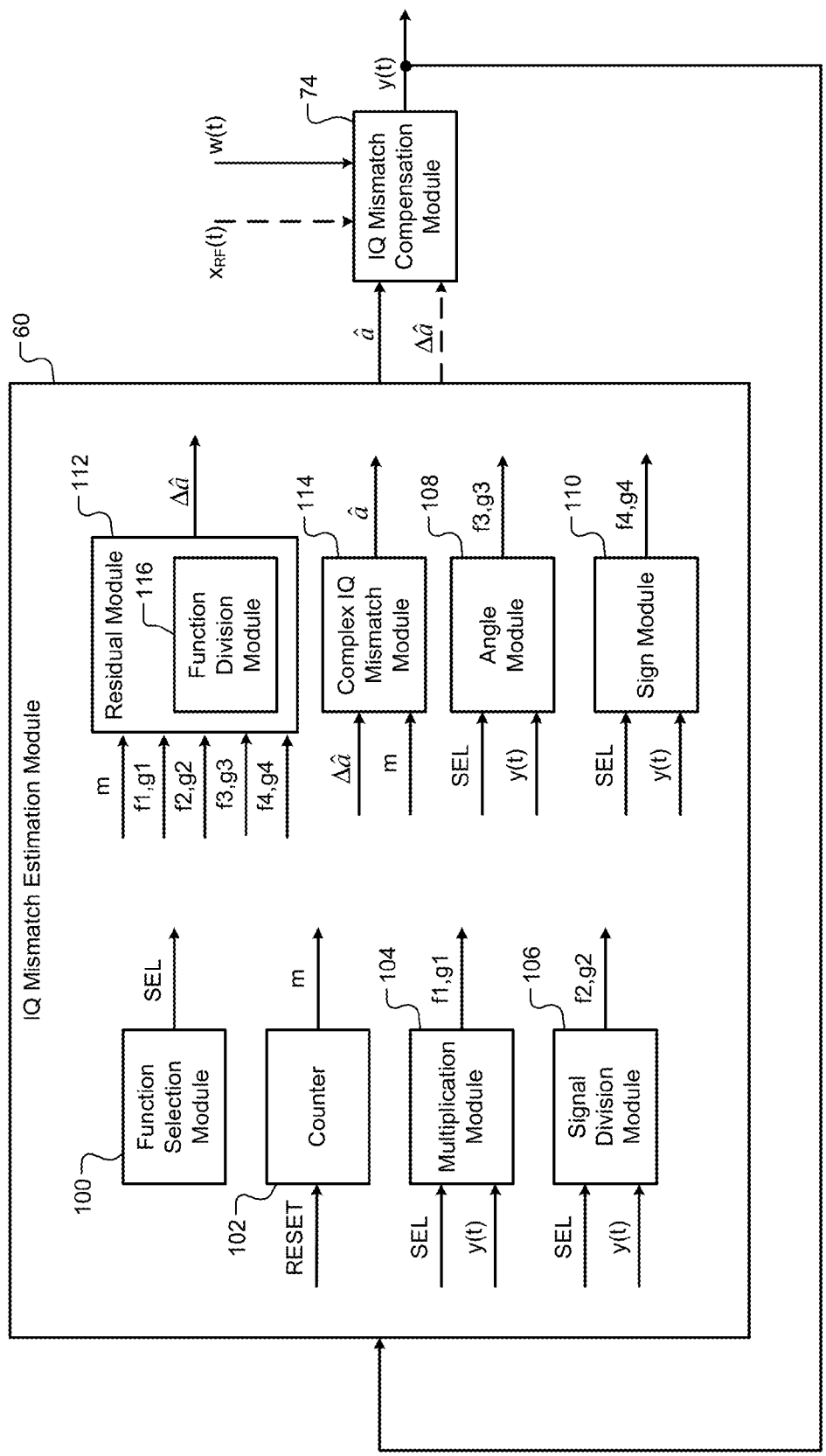
FIG. 5 is a functional block diagram of an IQ mismatch estimation module in accordance with an embodiment of the present disclosure.

FIG. 5 shows the IQ mismatch estimation module 60, which may include a function selection module 100, a counter 102, a multiplication module, 104, a signal division module 106, angle module 108, sign module 110, residual module 112, and a complex IQ mismatch module 114. The residual module 112 includes a function division module 116. These modules are described with respect to the method of FIG. 6.

Figure 6:
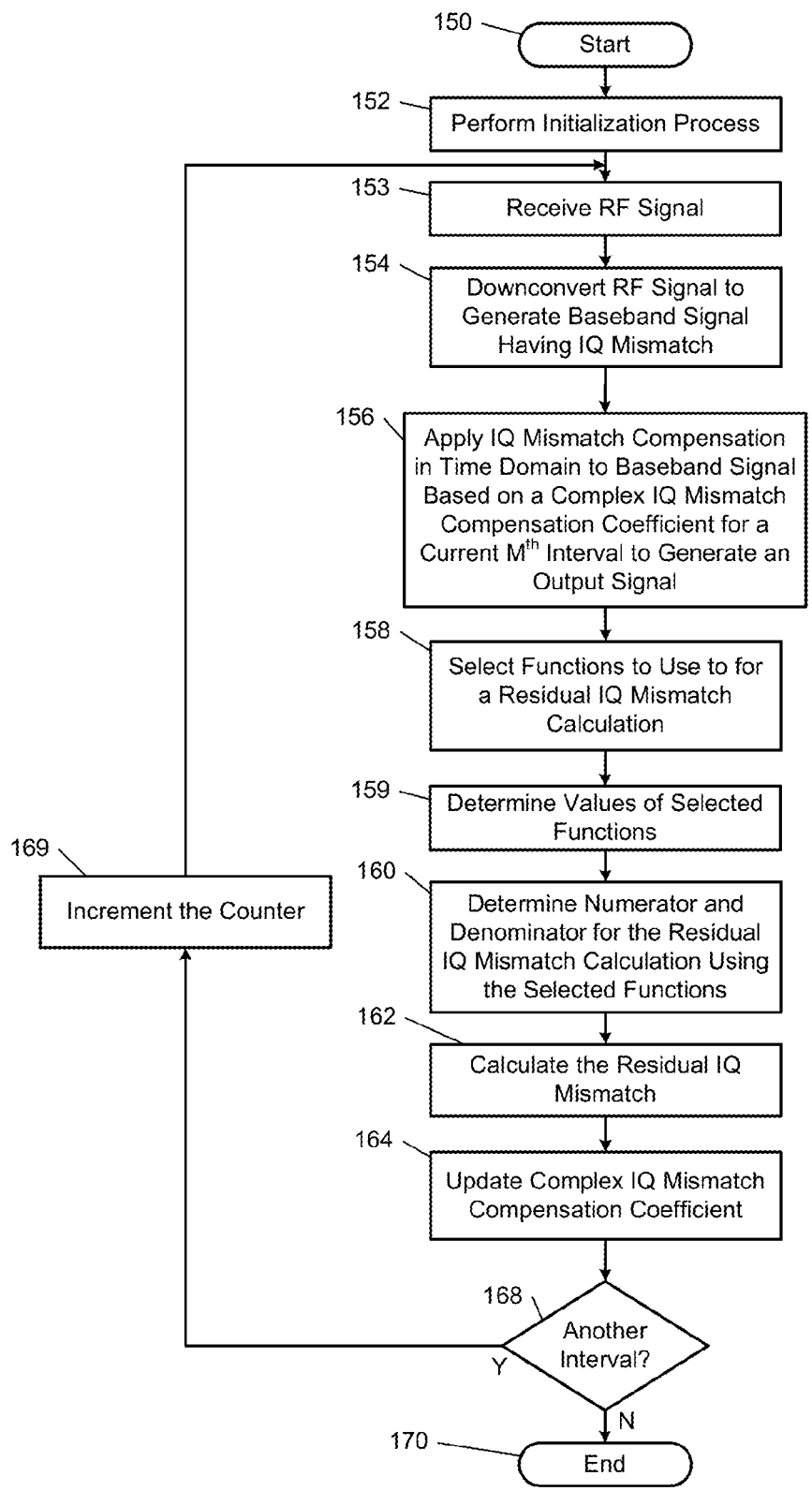
FIG. 6 illustrates an IQ mismatch compensation method in accordance with the present disclosure.

The systems and circuits disclosed herein may be operated using numerous methods. An example method is illustrated in FIG. 6. In FIG. 6, an IQ mismatch compensation method is shown. Although the following tasks are primarily described with respect to the implementations of FIGS. 3-5, the tasks may be easily modified to apply to other implementations of the present disclosure. The tasks may be iteratively performed.

The method may begin at 150. At 152, the counter 102 may be reset via a signal RESET. This may include setting the counter value m to 0 and initializing the estimated coefficient â (e.g., setting the estimated coefficient â to 0 or a pre-calibrated value if available). The counter value m may refer to a current $m^{th}$ interval. The $m^{th}$ interval refers to a current estimation interval index, where each estimation interval may be an average time duration to transmit and/or receive a packet or frame. As an example, the packet may be a WiFi packet. As another example, the frame may be a long-term evolution (LTE) frame. At 153, the signal $x_{RF}(t)$ is received at the downconversion module 72. At 154, the downconversion module 72 downconverts the received signal $x_{RF}(t)$ to provide the downconverted (or baseband) signal $w(t)$.

At 156, the IQ mismatch compensation module 74 applies an initial (or current) IQ mismatch compensation coefficient â(m) in the time domain to the baseband signal $w(t)$ for a current $m^{th}$ interval. The initial IQ mismatch compensation coefficient â(m) may be 0 and may increase with each iteration of tasks 156-166. The IQ mismatch compensation coefficient â(m) may increase until becoming equal to an actual IQ mismatch a for the receiver 53.

At 158, the function selection module 100 may select functions to use in an algorithm to determine the residual IQ mismatch $\Delta\hat{a}$. Four example sets of functions are described below with respect to task 160. Other functions may be utilized. The four functions sets include a multiplication function set, a division function set, an angle and complex exponent function set, and a sign and absolute value function set. Each of the sets of functions provides a first function $f(y(t), y^*(t))$ and a second function $g(y(t), y^*(t))$. As an alternative, the functions $f$ and $g$ may be predetermined and used at 160. The functions $f$ and $g$ are memoryless, i.e., only a current sample and a conjugate of the sample are used to calculate current values of the functions $f$ and $g$.

At 159, estimate values for the functions $f$ and $g$ are determined using the selected function set.

Multiplication

The multiplication module 104, based on the selection signal SEL and $y(t)$, uses the multiplication function set for the functions $f$ and $g$ (or $f_1$ and $g_1$ as shown in FIG. 5), as represented by equations 13 and 14. The parameter $\|y\|$ is a norm of $y(t)$.

$$f(y,y^*)=y^2 \quad (13)$$

$$g(y,y^*)=2y \cdot y^*=2\|y\|^2 \quad (14)$$

In the following equations $\Delta\hat{a}$ refers to $\Delta\hat{a}(m)$. For signals with zero-mean independent and identically distributed (i.i.d.) I and Q components, equations 13 and 14 lead to expected values provided by equations 15 and 16.

$$E[f(y,y^*)]=E[y^2]=E[x^2]+2\Delta\hat{a}E[\|x\|^2]+\Delta\hat{a}^2E[(x^*)]$$
$$=2\Delta\hat{a}E[\|x\|^2] \quad (15)$$

$$E[g(y,y^*)]=E[2\|y\|^2]=2(E[\|x\|^2]+\Delta\hat{a}^*E[x^2]+\Delta\hat{a}E[(x^*)^2]+\|\Delta\hat{a}\|^2E[\|x\|^2])=2E[\|x\|^2] \quad (16)$$

This results in an unbiased estimate of $\Delta\hat{a}(m)$ when the estimated values for the functions $f$ and $g$ are used in the below equations 32-34 of task 160. Note that the zero-mean i.i.d. condition is provided for square terms to average to zero. See the following equations 17-20.

$$E[x^2]=E[(x_I+jx_Q)^2]=E[x_I^2]-E[x_Q^2]+j2E[x_Ix_Q] \quad (17)$$

$$E[(x^*)^2]=E[(x_I-jx_Q)^2]=E[x_I^2]-E[x_Q^2]-j2E[x_Ix_Q] \quad (18)$$

$$E[x_I^2]-E[x_Q^2]=0, \text{ when IQ components are identically distributed} \quad (19)$$

$$E[x_Ix_Q]0, \text{ when IQ components are independent and have a zero-mean} \quad (20)$$

Division

The signal division module 106, based on the selection signal SEL and $y(t)$, uses the division function set for the functions $f$ and $g$ (or $f_2$ and $g_2$ as shown in FIG. 5), as represented by equations 21 and 22.

$$f(y,y^*)=\frac{y}{y^*} \quad (21)$$

$$g(y,y^*)=1 \quad (22)$$

For this selection $$E[f(y,y^*)]=E\left[\frac{y}{y^*}\right]=E\left[\frac{y^2}{\|y\|^2}\right]=E\left[\frac{x^2+2\Delta\hat{a}\|x\|^2+\Delta\hat{a}^2(x^*)^2}{\|x\|^2+\Delta\hat{a}^*x^2+\|\Delta\hat{a}\|^2\|x\|^2}\right]= \quad (23)$$

$$E\left[\frac{\frac{x^2}{\|x\|^2}+2\Delta\hat{a}+\Delta\hat{a}^2\frac{(x^*)^2}{\|x\|^2}}{1+\Delta\hat{a}^*\frac{x^2}{\|x\|^2}+\Delta\hat{a}\frac{(x^*)^2}{\|x\|^2}+\|a\|^2}\right]\approx$$

$$E\left[\left(\frac{(x^*)^2}{\|x\|^2}+2\Delta\hat{a}\right)\left(1-\Delta\hat{a}^*\frac{(x^*)^2}{\|x\|^2}-\Delta\hat{a}\frac{(x^*)^2}{\|x\|^2}\right)\right]=$$

$$E\left[\frac{(x^*)^2}{\|x\|^2}\right]-\Delta\hat{a}E\left[\frac{x^4}{\|x\|^4}\right]-\Delta\hat{a}+2\Delta\hat{a}-$$

$$2\|\hat{a}\|^2E\left[\frac{x^2}{\|x\|^2}\right]-2\Delta\hat{a}E\left[\frac{(x^*)^2}{\|x\|^2}\right]=\Delta\hat{a}$$

This results in an unbiased estimate of $\Delta\hat{a}(m)$ when the estimated values for the functions $f$ and $g$ are used in the below equations 32-33 of task 160. The approximation in the above derivation of equation 23 is due to the residual IQ mismatch Δâ(m) being a small complex number.

Angle

The angle module 108, based on the selection signal SEL and y(t), uses the angle and complex exponent function set for the functions $f$ and $g$ (or $f_3$ and $g_3$ as shown in FIG. 5), as represented by equations 24 and 25. The parameter $j=\sqrt{-1}$.

$$f(y,y^*) = e^{j2\angle y} \quad (24)$$

$$g(y,y^*) = 1 \quad (25)$$

Note that the function $f$ can be expressed as shown by equation 26.

$$f(y, y^*) = e^{j2\angle y} = \left(\frac{y}{\|y\|}\right)^2 = \frac{y^2}{\|y\|^2} = \frac{y}{y^*} \quad (26)$$

Thus, the same derivation of expected values holds as in the case of the previously described division function set, which results in an unbiased estimate of Δâ(m).

Figure 7:
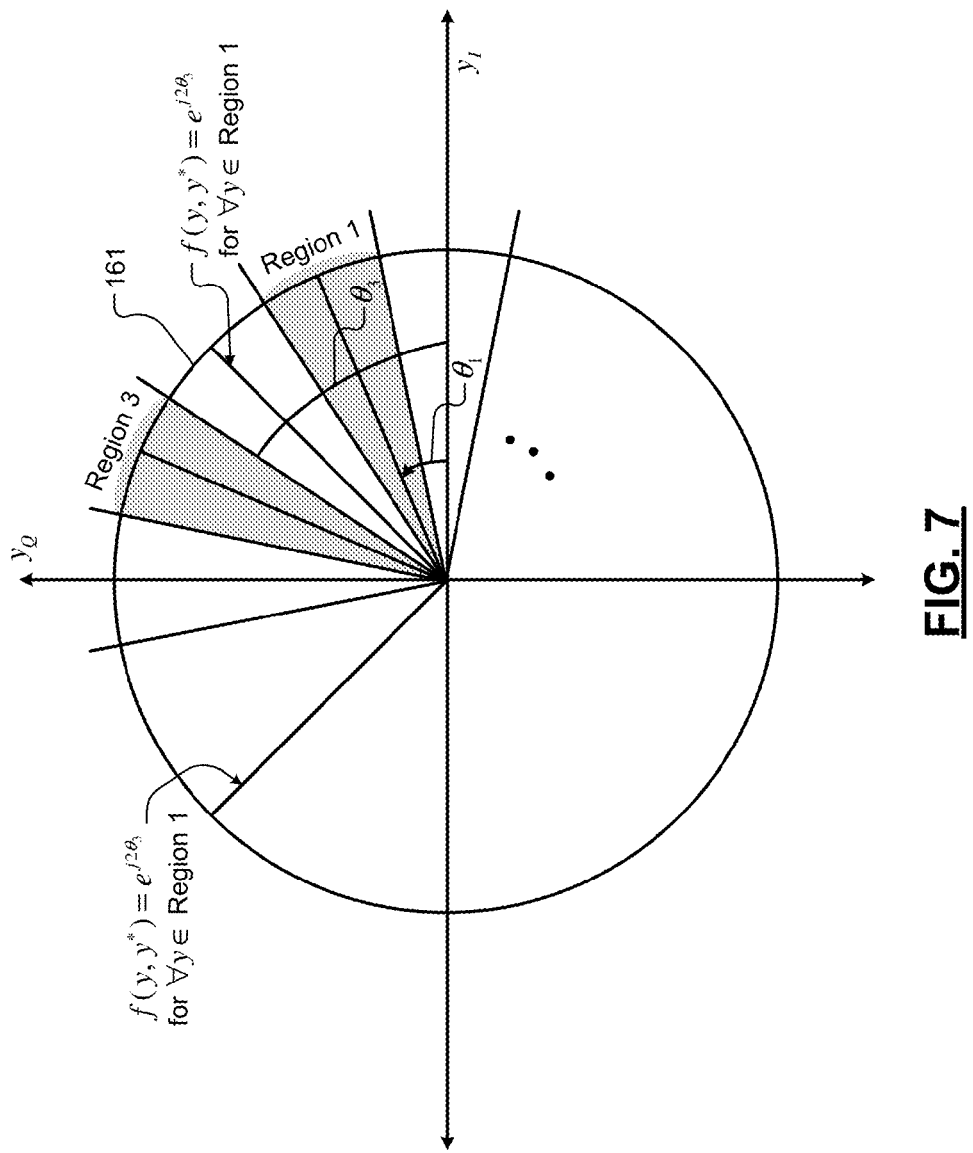
FIG. 7 is an angular region plot in accordance with the present disclosure.

FIG. 7 shows an example of an angular region plot that may be used with the angle and complex exponent function set. For implementation simplification, angle approximation can be used (e.g., by dividing the full range of angles [0, 2π] into N segments and using a fixed angle for all y values falling in a given segment). As an example, a circular region 161 shown in FIG. 7 may be divided into N equal segments. A fixed and/or predetermined angle may be used for component values $y_I$, $y_Q$ within a certain one of the N segments. For example, if the component values $y_I$, $y_Q$ are in Region 1, then $\theta_1$ may be used to estimate the function $f$. As another example, if the component values $y_I$, $y_Q$ are in Region 3, then $\theta_3$ may be used to estimate the function $f$. These examples may be respectively expressed by equations 27 and 28, where e is an irrational and transcendental constant, which may be equal to 2.71828.

$$f(y,y^*) = e^{j2\theta_3} \text{ for } \forall y \in \text{Region 3} \quad (27)$$

$$f(y,y^*) = e^{j2\theta_1} \text{ for } \forall y \in \text{Region 1} \quad (28)$$

Sign and ABS

The sign module 110, based on the selection signal SEL and y(t), uses the sign and absolute value (ABS) function set for the functions $f$ and $g$ (or $f_4$ and $g_4$ as shown in FIG. 5), as represented by equations 29-31. The function sign( ) is used to determine the sign (+1 or −1) of a value. The function || is used to determine absolute value of a real number.

$$f(y, y^*) = |y_I| - |y_Q| + j\frac{1}{2}(y_I \text{sign}(y_Q) + y_Q \text{sign}(y_I)), \quad (29)$$

$$g(y, y^*) = |y_I| + |y_Q|$$

$$y_I = \frac{y + y^*}{2} \quad (30)$$

$$y_Q = \frac{y - y^*}{2j} \quad (31)$$

The corresponding derivation of expected values for the sign and absolute value function set is omitted, but this selection also results in an unbiased estimate of Δâ(m). The corresponding algorithm includes simple operations (sign and absolute value) without use of multiplication or division of y and y*.

At 160, the residual module 112 (or estimator) may determine a numerator NUM(m) and a denominator D(m) for a residual IQ mismatch calculation using the expected values of the functions $f$ and $g$ provided at 159. Equation 32 may be used to estimate a residual IQ mismatch Δâ(m).

$$\Delta\hat{a} = \frac{E[f(y(t), y^*(t))]}{E[g(y(t), y^*(t))]} \quad (32)$$

If the underlying process is ergodic, the expected values may be estimated using time domain averages within a current estimation interval (e.g., the $m^{th}$ interval) using equation 33, where m is the current estimation interval index and $N_m$ is the number of samples in the current estimation interval.

$$\Delta\hat{a}(m) = \frac{NUM(m)}{D(m)} = \frac{\frac{1}{N_m}\sum_{n=1}^{N_m} f(y(n), y^*(n))}{\frac{1}{N_m}\sum_{n=1}^{N_m} g(y(n), y^*(n))} \frac{\sum_{n=1}^{N_m} f(y(n), y^*(n))}{\sum_{n=1}^{N_m} g(y(n), y^*(n))} \quad (33)$$

The process is ergodic if an average of the expected values over time is equal to an average of realized estimated values. Compensated IQ mismatch samples y(n) for the current $m^{th}$ interval are used to determine the numerator NUM (m) and denominator D(m).

At 162, the function division module 116, based on equation 32 and/or equation 33, divides a numerator by a denominator to estimate the residual IQ mismatch Δâ(m). The numerator and the denominator may be the numerator and the denominator of equation 32 or the numerator and the denominator of equation 33. As an alternative to using division to estimate the residual IQ mismatch Δâ(m), an approximate normalization may be used to reduce complexity by, for example, right shifting by a denominator exponent. For example, equation 34 may be used instead of the division provided by equations 32 and 33 to estimate the residual IQ mismatch Δâ(m).

$$\Delta\hat{a}(m) = \frac{NUM(m)}{h(D(m))}, \quad (34)$$

where, for example, $$h(D(m)) = D(m) \text{ or } h(D(m)) = 2^{\lfloor \log_2 D(m) \rfloor}$$

Any residual error due to approximate normalization may be corrected in subsequent updates of the complex IQ mismatch coefficient â.

At 164, the complex IQ mismatch module 114 updates the complex IQ mismatch coefficient â(m+1). The estimate of the residual IQ mismatch Δâ(m) is used to update the complex IQ mismatch compensation coefficient â(m+1) for the next (m+1) interval. The complex IQ mismatch coefficient â(m+1) may be determined using equation 35, where μ and δ are selected constants and/or predetermined values, where μ is a small scaling factor controlling convergence speed and steady state variance, and δ is a saturation value used to limit impact of outlier values.

$$\hat{a}(m+1)=\hat{a}(m)+\mu \cdot \max(-\delta, \min(\Delta\hat{a}(m), \delta)) \quad (35)$$

The update of the complex IQ mismatch compensation coefficient can be performed in a number of ways. The example provided uses a scaled and saturated estimate of $\Delta\hat{a}(m)$.

For a first iteration of the process, $\hat{a}(m)$ may be equal to 0 and thus $\Delta\hat{a}(m)$ may be equal to a. During the iterations of the process, $\hat{a}(m)$ may converge to a and thus $\Delta\hat{a}(m)$ may converge to 0.

At 168, if one or more additional estimates are to be determined for another interval, task 169 is performed, otherwise the method may end at 170. At 169, the counter 102 is incremented. Task 153 is performed subsequent to task 169.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A receiver comprising:
    a physical layer module configured to (i) receive a signal, and (ii) downconvert the signal to generate a downconverted signal, wherein the downconverted signal has in-phase and quadrature phase (IQ) mismatch;
    a function module configured to determine (i) a first value based on a first function and a resultant signal, and (ii) a second value based on a second function;
    a residual module configured to estimate a residual IQ mismatch based on the first value and the second value;
    an IQ mismatch module configured to estimate an IQ mismatch coefficient based on the estimate of the residual IQ mismatch; and
    a compensation module configured to compensate for the IQ mismatch of the downconverted signal including generating the resultant signal based on the estimate of the IQ mismatch.

2. The receiver of claim 1, wherein the function module is configured to determine the first value based on a conjugate of the resultant signal.

3. The receiver of claim 1, wherein the function module is configured to determine the first value based on a square of the resultant signal.

4. The receiver of claim 1, wherein the function module is configured to determine the second value based on the resultant signal.

5. The receiver of claim 1, wherein the function module is configured to determine the second value based on a conjugate of the resultant signal.

6. The receiver of claim 1, wherein the function module is configured to determine:
    the first value based on a square of a sample of the resultant signal; and
    the second value based on (i) the sample of the resultant signal, and (ii) a conjugate of the sample of the resultant signal.

7. The receiver of claim 1, wherein:
    the function module is configured to determine the first value based on a sample of the resultant signal divided by a conjugate of the sample of the resultant signal; and
    the second value is equal to 1.

8. The receiver of claim 1, wherein:
    the function module is configured to determine (i) an angle based on I and Q components of a sample of the resultant signal, and (ii) the first value based on the angle; and
    the second value is equal to 1.

9. The receiver of claim 1, wherein:
    the function module is configured to determine the first value based on (i) a sign and an absolute value of an I component of a sample of the resultant signal, and (ii) a sign and an absolute value of a Q component of the sample of the resultant signal; and
    the second value is based on (i) the absolute value of the I component of the sample of the resultant signal, and (ii) the absolute value of the Q component of the sample of the resultant signal.

10. A method comprising:
    receiving a signal;
    downconverting the signal to generate a downconverted signal, wherein the downconverted signal has in-phase and quadrature phase (IQ) mismatch;
    determining (i) a first value based on a first function and a resultant signal, and (ii) a second value based on a second function;
    estimating a residual IQ mismatch based on the first value and the second value;
    estimating an IQ mismatch coefficient based on the estimate of the residual IQ mismatch; and
    compensating for the IQ mismatch of the downconverted signal including generating the resultant signal based on the estimate of the IQ mismatch coefficient.

11. The method of claim 10, comprising determining the first value based on a conjugate of the resultant signal.

12. The method of claim 10, comprising determining the first value based on a square of the resultant signal.

13. The method of claim 10, comprising determining the second value based on the resultant signal and a conjugate of the resultant signal.

14. The method of claim 10, comprising determining:
    the first value based on a square of a sample of the resultant signal; and
    the second value based on (i) the sample of the resultant signal, and (ii) a conjugate of the sample of the resultant signal.

15. The method of claim 10, comprising determining the first value based on the resultant signal divided by a conjugate of the resultant signal,
    wherein the second value is equal to 1.

16. The method of claim 10, comprising determining (i) an angle based on I and Q components of the resultant signal, and (ii) the first value based on the angle,
    wherein the second value is equal to 1.

17. The method of claim 10, comprising determining:
    the first value based on (i) a sign and an absolute value of an I component of the resultant signal, and (ii) a sign and an absolute value of a Q component of the resultant signal; and
    the second value is based on (i) the absolute value of the I component of the resultant signal, and (ii) the absolute value of the Q component of the resultant signal.

* * * * *